(12) United States Patent
Tsukahara et al.

(10) Patent No.: US 7,180,749 B2
(45) Date of Patent: Feb. 20, 2007

(54) CIRCUIT BOARD AND ITS MANUFACTURING METHOD

(75) Inventors: Norihito Tsukahara, Kyoto (JP); Kazuhiro Nishikawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 313 days.

(21) Appl. No.: 10/727,650

(22) Filed: Dec. 5, 2003

(65) Prior Publication Data

US 2004/0134681 A1    Jul. 15, 2004

(30) Foreign Application Priority Data

Dec. 6, 2002    (JP) ............................. 2002-355153

(51) Int. Cl.
*H05K 1/18* (2006.01)
(52) U.S. Cl. .................. 361/761; 361/763; 361/766; 361/793; 361/782; 361/821
(58) Field of Classification Search ............... 361/782, 361/793, 821
See application file for complete search history.

(56) References Cited

U.S. PATENT DOCUMENTS

| | | | | |
|---|---|---|---|---|
| 5,874,770 A | * | 2/1999 | Saia et al. ................. | 257/536 |
| 6,021,050 A | * | 2/2000 | Ehman et al. ............. | 361/793 |
| 6,356,455 B1 | * | 3/2002 | Carpenter .................. | 361/793 |
| 6,538,210 B2 | * | 3/2003 | Sugaya et al. ............. | 174/258 |
| 6,806,428 B1 | * | 10/2004 | Kimura et al. ............ | 174/260 |
| 2003/0221864 A1 | * | 12/2003 | Bergstedt et al. .......... | 174/260 |
| 2004/0037061 A1 | * | 2/2004 | Liu et al. ................... | 361/793 |
| 2004/0150966 A1 | * | 8/2004 | Hu ............................ | 361/763 |

FOREIGN PATENT DOCUMENTS

| | | |
|---|---|---|
| JP | 2001-53413 | 2/2001 |
| JP | 2001-93934 | 4/2001 |

* cited by examiner

*Primary Examiner*—Dean A. Reichard
*Assistant Examiner*—Hoa C. Nguyen
(74) *Attorney, Agent, or Firm*—Wenderoth, Lind & Ponack, L.L.P.

(57) ABSTRACT

A circuit board comprises a base film that is a base layer, a first conductive circuit manufactured by hardening conductive paste material formed in a predetermined shape on the base film, a first insulating layer manufactured by hardening insulating paste material formed on the base film and the first conductive circuit, and a second conductive circuit manufactured by hardening conductive paste material in a predetermined shape on the first insulating layer, wherein an electronic part built-in by the first insulating layer and second insulating layer is connected to the second conductive circuit, and the first conductive circuit is connected to the second conductive circuit through a via hole.

15 Claims, 11 Drawing Sheets

CIRCUIT BOARD AND ITS MANUFACTURING METHOD

FIELD OF THE INVENTION

The present invention relates to a circuit board with a conductive circuit, and a circuit board equipped with a resistor, capacitor and semiconductor integrated circuit element, or the like, and its manufacturing method.

BACKGROUND OF THE INVENTION

Recently, there is a great demand for miniaturization of electronic equipment such as cellular phones in particular, and circuit boards built into electronic equipment are also required to be smaller, thinner, and higher in mounting density. For example, in Japanese Laid-open Patent 2001-53413, disclosed is a method of manufacturing electronic part built-in boards in which electronic parts are mounted by coating electronic parts in such a manner as to expose a connection of at least one electronic part, and forming a metallic pattern on a resin surface including the exposed connection. Further, a method of manufacturing a multi-layer electronic part built-in board by laminating boards is also disclosed. By using such a configuration, it is possible to greatly reduce size and to improve mounting density of a circuit board.

Further, in Japanese Laid-open Patent 2001-93934, disclosed is a method of forming a circuit pattern with use of conductive paste on a pattern formed surface of a substrate including a circuit connection, inserting a semiconductor integrated circuit element into a substrate, and exposing circuit connections of the semiconductor integrated circuit element on the pattern formed surface of the substrate. Thus, it is possible to prevent the semiconductor integrated circuit element from sinking into the substrate without using anisotropic conductive resin during mounting, to thereby improve productivity and to lower cost, and further, to prevent generation of defects such as breaking of circuit patterns. However, when a multi-layer board is manufactured by such methods, as with a conventional method of manufacturing multi-layer boards, thickness is increased because a multi-layer circuit board is manufactured by laminating a plurality of circuit boards with electronic parts built-in. In case of configuring a complicated circuit board, thickness tends to further increase because a number of laminated layers of circuit boards mounted with electronic parts is increased. Accordingly, it becomes difficult to reduce a thickness of the circuit board.

SUMMARY OF THE INVENTION

The present invention is intended to solve the above problems, and an object is to realize further reduction in size of multi-layer circuit boards.

A circuit board of the present invention comprises:

a base layer;

a first conductive circuit, manufactured by hardening a conductive paste material formed in a predetermined shape on the base layer;

a first insulating layer, manufactured by hardening an insulating paste material formed on the base layer and the first conductive circuit; and a second conductive circuit, manufactured by hardening a conductive paste material formed in a predetermined shape on the first insulating layer.

By using this configuration, a multi-layer circuit structure can be realized at a relatively low temperature by using a method of applying a conductive paste material and insulating paste material. As a result, it is possible to obtain thin circuit boards using inexpensive plastic film, and to laminate these boards into a thin and flexible board.

Further, a circuit board of the present invention can comprise:

a part arrangement layer with electronic parts arranged so that an electrode terminal formed at a surface of an electronic part is exposed on the surface; and a conductive circuit electrically connected to the electrode terminal and formed in a predetermined shape, wherein the part arrangement layer comprises:

a first conductive circuit, formed by hardening a conductive paste material formed in a predetermined shape, and an insulating layer, formed by hardening an insulating paste material applied to the first conductive circuit, which insulating layer is formed in such a manner that the electrode terminal is exposed on a surface of the insulating layer.

Due to the above configuration, it is possible to form conductive circuits or insulating layers at relatively low temperatures, and even when electronic parts such as semiconductor integrated circuit elements are mounted, reliability is not affected and it is possible to realize a circuit board that is thin as a whole and highly reliable. Also, even with electronic parts built in, it is possible to realize a circuit board that is thin as a whole.

DETAILED DESCRIPTION OF THE PREFERRED EMBODIMENTS

Figure 1:
FIG. 1 is a sectional view of a base film, out of sectional views showing a main manufacturing process of a circuit board of a first exemplary embodiment of the present invention.

A circuit board and its manufacturing method of the present invention will be described in detail in the following with reference to the drawings. Incidentally, like reference numerals refer to like component elements in the drawings.

First Exemplary Embodiment

Figure 10:
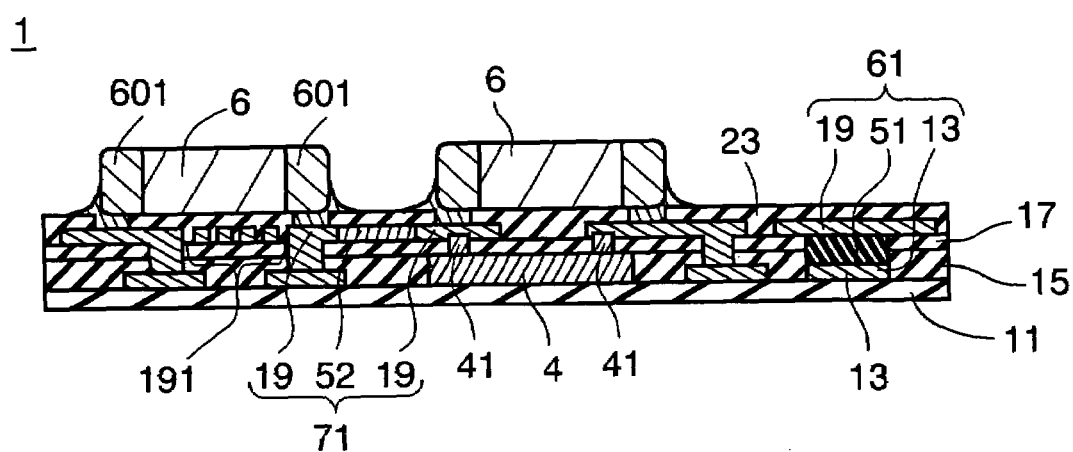
FIG. 10 shows a sectional view of a completed circuit board of the first exemplary embodiment.
Figure 11:
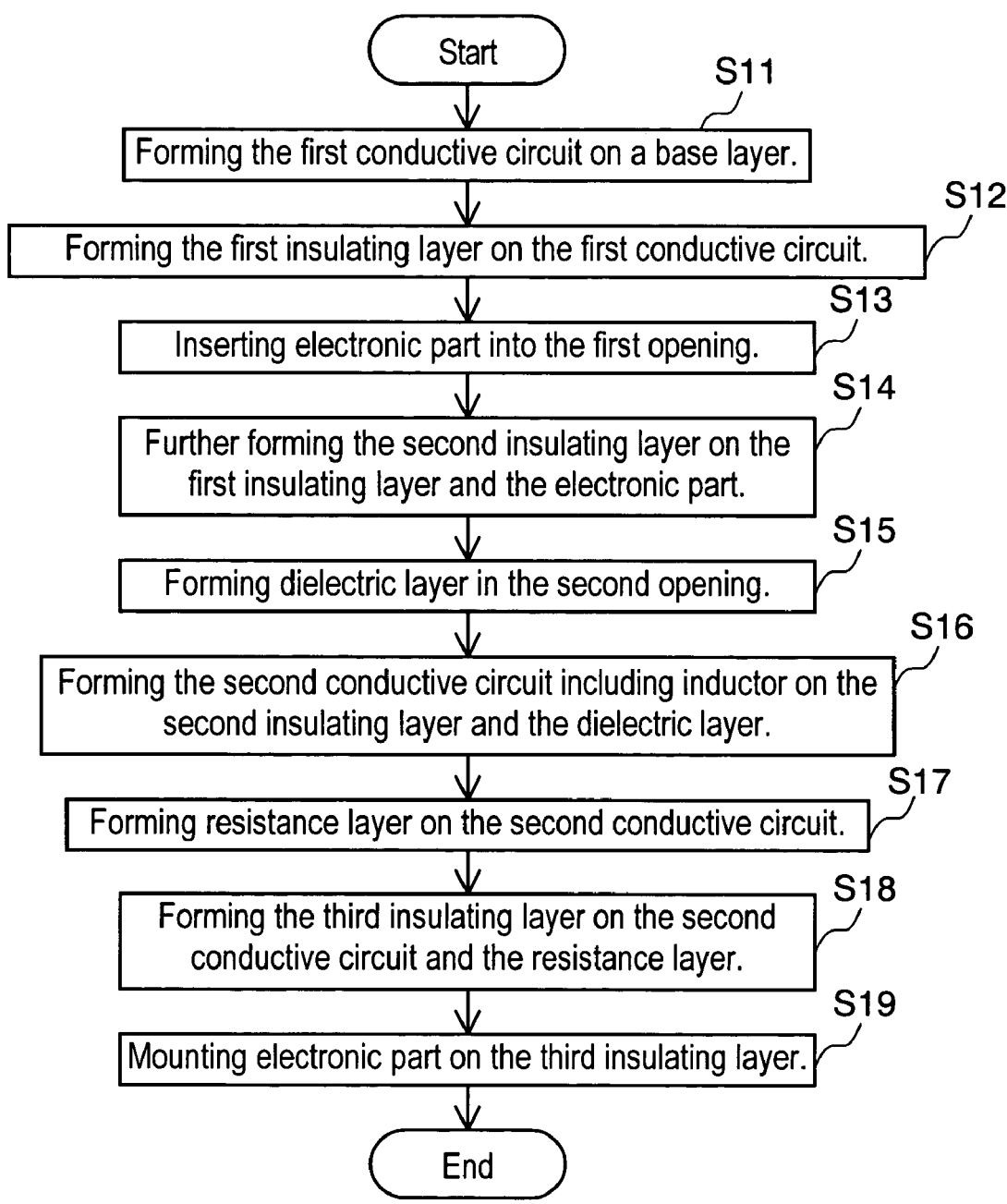
FIG. 11 is a flowchart showing the main manufacturing process of the circuit board of the first exemplary embodiment.

FIG. 1 to FIG. 9 show sectional views of circuit board 1 during major manufacturing steps of a first exemplary embodiment of the present invention. FIG. 10 shows a sectional shape of completed circuit board 1. Also, FIG. 11 is a flow chart of a manufacturing process of the present exemplary embodiment. The circuit board 1 of the present exemplary embodiment shown in FIG. 10 is just an example. It is preferable to execute steps depicted by FIG. 1 to FIG. 9 a plurality of times and to omit unnecessary steps.

When the circuit board 1 is to be manufactured, as shown in FIG. 1, a base film of about 100 μm thick is used as a base layer. In the present exemplary embodiment, the base layer is described as base film 11 in the following. As the base film 11, it is desirable to use polyethylene telephthalate (PET) resin, acrylonitrile-butadiene styrene (ABS) resin or polycarbonate resin, but it is also possible to use resin that is relatively high in heat resistance such as polyimide resin.

Figure 2:
FIG. 2 is a sectional view of a first conductive circuit, out of the sectional views showing the main manufacturing process of the circuit board of the first exemplary embodiment.

Next, as shown in FIG. 2, first conductive circuit 13 is formed by heating and hardening a wiring pattern of conductive paste material, such as silver paste, printed onto the base film 11 by performing screen printing or offset printing (step S11).

The silver paste is a mixture of thermosetting and heat shrinking resin and silver powder, and when the silver paste is heated after printing, the resin hardens and shrinks, and thereby, the first conductive circuit 13 is formed.

Figure 3:
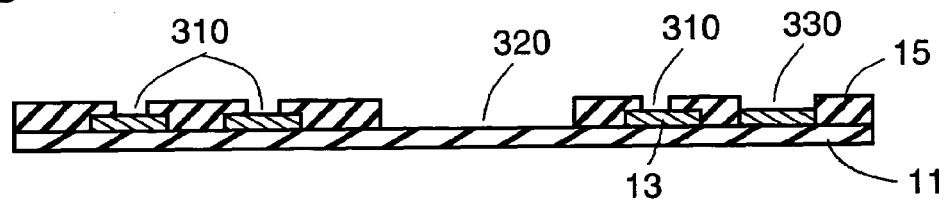
FIG. 3 is a sectional view of a first insulating layer, out of the sectional views showing the main manufacturing process of the circuit board of the first exemplary embodiment.

Next, as shown in FIG. 3, insulating paste material is printed onto the base film 11 and the first conductive circuit 13 by performing a screen printing process or the like, and this paste material is heated and hardened to form first insulating layer 15 (step S12). In this case, the first insulating layer 15 is not printed onto predetermined portions of the first conductive circuit 13. These predetermined portions correspond to via 310, a connection opening for electrical connection with second conductive circuit 19 to be formed later, and second opening 330 for forming a conductive paste material. Also, when the first insulating layer is formed, first opening 320 for inserting electronic part 4 is defined on the base film 11.

Figure 4:
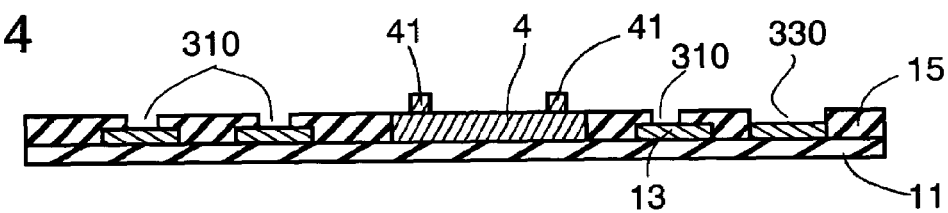
FIG. 4 is a sectional view of an electronic part inserted in a first opening, out of the sectional views showing the main manufacturing process of the circuit board of the first exemplary embodiment.

Subsequently, as shown in FIG. 4, the electronic part 4 is inserted in such manner as to bury it into the first opening 320 (step S13). As the electronic part 4, for example, it is desirable to use a semiconductor integrated circuit element (bare chip IC) of bare chip configuration, and it is preferable to have bumps as electrode terminals 41 as shown in FIG. 4. The electronic part 4 is inserted in such manner that the electrode terminals 41 are positioned at a side opposite to the base film 11; that is, a surface opposite to the electrode terminals 41 is in contact with the base film 11. As the electronic part 4, it is preferable to use a semiconductor integrated circuit element (package IC) of package configuration as well as a bare chip IC. Further, it is also preferable to use a chip type electronic part such as a resistor or capacitor, or multiple chip type electronic parts including a plurality of these parts.

Figure 5:
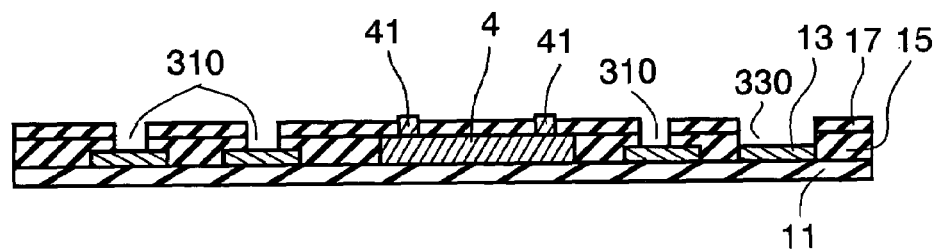
FIG. 5 is a sectional view of a second insulating layer, out of the sectional views showing the main manufacturing process of the circuit board of the first exemplary embodiment.

Next, as shown in FIG. 5, an insulating paste material is printed onto the first insulating layer 15 formed and the electronic part 4 by performing a screen printing process or the like, and this paste material is heated and hardened to form second insulating layer 17 (step S14). In this case, the paste material is not printed on the via 310 and the second opening 330 of the first insulating layer 15, and also nearly only surfaces of the electrode terminals 41 of the electronic part 4 are exposed from the second insulating layer 17. In this way, the electronic part 4 is buried in the second insulating layer 17 as a whole. In order to prevent the electronic part 4 from being damaged, the insulating paste materials used are desirable to harden at 120° C. or lower, and more preferably, at 110° C. or lower.

Figure 6:
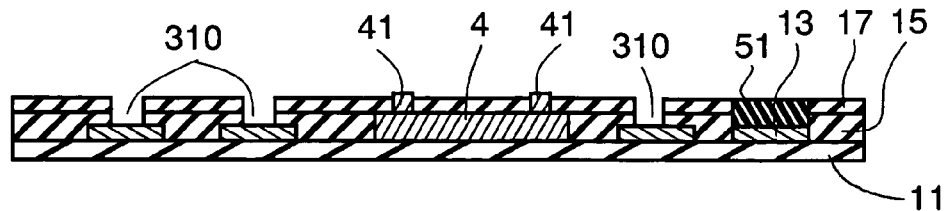
FIG. 6 is a sectional view of a dielectric layer, out of the sectional views showing the main manufacturing process of a circuit board in the first exemplary embodiment.

Subsequently, as shown in FIG. 6, dielectric paste material is applied to the second opening 330, followed by heating and hardening (step S15). In this way, dielectric layer 51 is formed in the second opening 330. It is also preferable to execute heating and hardening of the dielectric paste material simultaneously with heating and hardening of the insulating paste material that is to form the second insulating layer 17.

Figure 7:
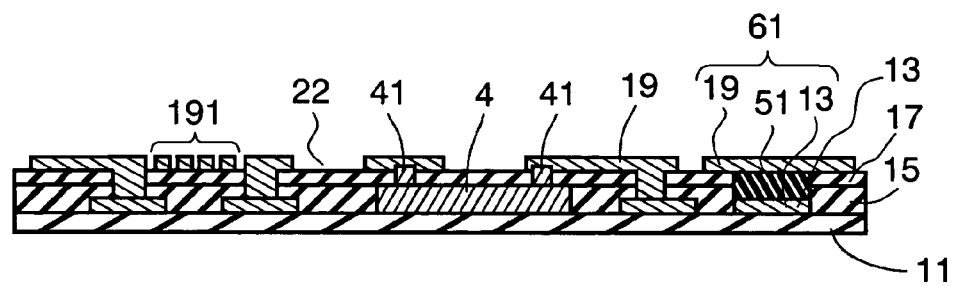
FIG. 7 is a sectional view of a second conductive circuit, out of the sectional views showing the main manufacturing process of the circuit board of the first exemplary embodiment.

Next, as shown in FIG. 7, conductive paste material composed of silver paste is printed onto the second insulating layer 17 and the dielectric layer 51 by screen printing or the like, followed by heating and hardening this conductive paste material to form second conductive circuit 19 (step S16). In this case, as shown in FIG. 6 and FIG. 7, the silver paste is formed in the via 310 as well, and therefore, the first conductive circuit 13 and the second conductive circuit 19 are electrically connected to each other through the via 310. Thus, it is possible to simultaneously form the second conductive circuit 19 and to connect it to the first conductive circuit 13 through the via 310. Accordingly, the manufacturing process can be simplified. Also, by printing the conductive paste material in such manner as to make a connection with the electrode terminals 41 of the electronic part 4, it is possible to obtain the second conductive circuit 19 also being connected with the electrode terminals 41 of the electronic part 4.

Further, simultaneously with printing, a generally spiral or meandering pattern is formed on the second conductive circuit 19, followed by heating and hardening this pattern to form inductor 191. In the case of an inductor having a spiral pattern, one of the electrodes can be connected to the first conductive circuit 13. Also, as a result of forming the second conductive circuit 19, both surfaces of the dielectric layer 51 in a direction of its thickness are sandwiched between the first conductive circuit 13 and the second conductive circuit 19. Therefore, capacitor 61 is configured to include a conductor of first conductive circuit 13, dielectric layer 51, and a conductor of second conductive circuit 19.

In the above process, in order to prevent the electronic part 4 from being damaged, it is desirable to use conductive paste material which hardens at 120° C. or lower, and more preferably, at 110° C. or lower. The first insulating layer 15 and the second insulating layer 17 serve to electrically insulate the first conductive circuit 13 from the second conductive circuit 19 except the portion corresponding to via 310.

Figure 8:
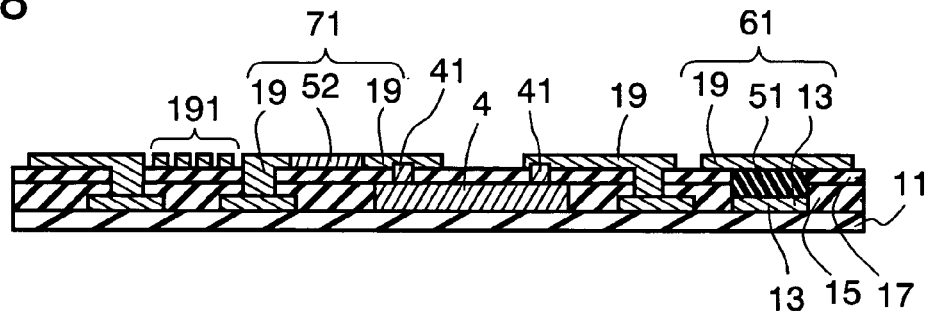
FIG. 8 is a sectional view of a resistive layer, out of the sectional views showing the main manufacturing process of the circuit board of the first exemplary embodiment.

The second conductive circuit 19 is further provided with gap 22. As shown in FIG. 8, resistant paste material is applied to the gap 22. And, the resistant paste material is heated and hardened to form resistive layer 52. Each end of the reistive layer 52 in the gap 22 is electrically connected with the conductor of first conductive circuit 13, thereby configuring resistor 71 (step S17). It is preferable to execute heating and hardening of the resistance paste material simultaneously with heating and hardening of conductive paste material that is to form the the second conductive circuit 19.

Figure 9:
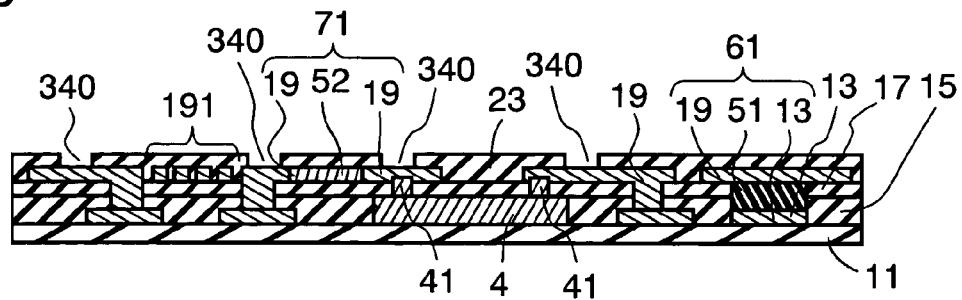
FIG. 9 is a sectional view of a third insulating layer, out of the sectional views showing the main manufacturing process of the circuit board of the first exemplary embodiment.

Next, as shown in FIG. 9, insulating paste material is printed on the second conductive circuit 19, resistor 71 and the second insulating layer 17 by screen printing or the like, followed by heating and hardening this insulating paste material to form third insulating layer 23 (step S18). The third insulating layer 23 is provided with via 340 as needed, which is a connection opening where the second conductive circuit 19 is exposed.

Finally, as shown in FIG. 10, electronic parts, for example chip type electronic parts 6 such as resistors and capacitors, are mounted on the third insulating layer 23. As to these chip type electronic parts 6, the second conductive circuit 19 and electrodes 601 of the chip type electronic parts 6 are electrically connected to each other through via 340 by virtue of solder or a conductive bonding agent (step S19). It is preferable to mount a connector, or the like, used to install the circuit board 1 in electronic equipment (not shown) through the via 340.

According to the above process, the circuit board 1 in the present exemplary embodiment can be manufactured. In the case of circuit board 1 of the present exemplary embodiment, the first conductive circuit 13, the second conductive circuit 19, the first insulating layer 15, the second insulating layer 17, and the third insulating layer 23 are formed by using conductive paste material and insulating paste material, which are laminated to obtain a multilayer circuit structure. As a result, it is possible to thin the circuit board as a whole. Also, since a circuit structure is formed on the base film 11, the circuit board has excellent flexibility and can be used as a circuit board furnished with functional elements for various types of electronic equipment.

As the circuit board 1 of the present exemplary embodiment, besides the configuration shown in FIG. 10, it is preferable to finally remove the base film 11 before using the circuit board. In this way, a circuit board more reduced in size can be realized. When using such a configuration, it is not necessary to use a base film as described in the present exemplary embodiment, but preferable to use a plate member. As such plate member, it is desirable to use a plate member which is easy to remove by virtue of being less adhesive to materials for forming conductive circuits, such as silver paste, and materials for forming insulating layers.

Also, since the circuit board of the present exemplary embodiment is manufactured by using conductive paste material and insulating paste material, with use of application methods including printing and repeating steps of heating and hardening, circuit boards equipped with various types of electronic parts can be easily manufactured.

Also, as for the first conductive circuit 13, the second conductive circuit 19, the first insulating layer 15, the second insulating layer 17, and the third insulating layer 23, complicated circuits can be manufactured without damaging built-in electronic part 4 by using materials which harden at relatively low temperatures.

Further, in the circuit board 1 of the present exemplary embodiment, inductor 191 is disposed on the second conductive circuit 19, capacitor 61 is disposed by holding the dielectric layer 51 between the first conductive circuit 13 and the second conductive circuit 19, and resistor 71 is disposed by forming the reistive layer 52 in the gap 22 of the second conductive circuit 19. Accordingly, it is possible to obtain the circuit board 1 having complicated circuits with excellent function while realizing a reduction in thickness.

The circuit board 1 shown in FIG. 10 is just an example, and it is preferable to dispose the inductor 191 on the first conductive circuit 13 and to dispose resistive layer 52 in a gap formed in the first conductive circuit 13.

Further, it is possible to form a resistive layer by heating and hardening a resistance paste material applied to the second opening 330. In this case, a resistive layer is formed between first conductive circuit 13, which is a lower layer, and second conductive circuit 19, which is an upper layer, thereby forming a resistor in a vertical direction. Also, it is possible to heat and harden the dielectric paste material applied to the gap 22, to be formed into the second conductive circuit 19 so as to form a dielectric layer thereon. In this case, a capacitor is formed in a horizontal direction because second conductive circuits 19 connected to the dielectric layer serve as electrodes respectively at both sides by being flush with each other. Thus, in the flow chart shown in FIG. 11, it is possible to freely form a dielectric layer and reistive layer by properly changing the paste material in step S15 and step S17.

Figure 12:
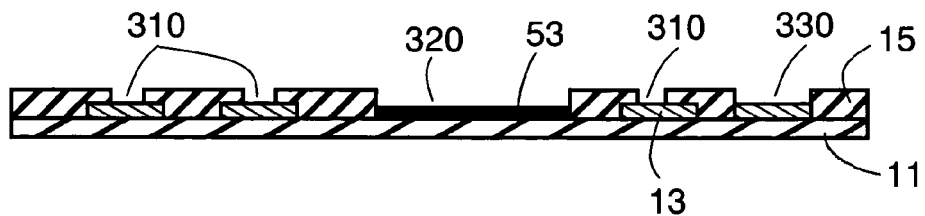
FIG. 12 is a sectional view showing a state of adhesive applied to the first opening, for describing a manufacturing process of a modification of the circuit board of the first exemplary embodiment.
Figure 13:
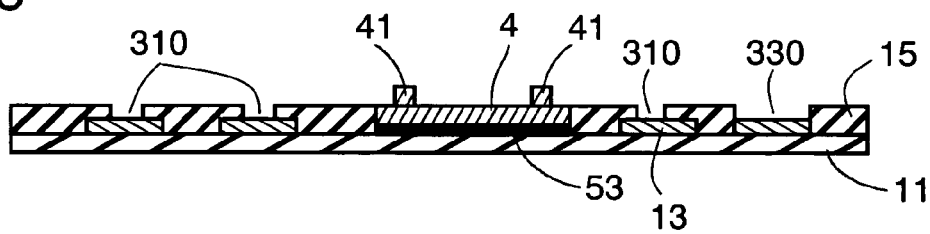
FIG. 13 is a diagram showing a state of an electronic part inserted into the first opening and fixed with the adhesive, for describing the manufacturing process of the modification of the circuit board of the first exemplary embodiment.
Figure 14:
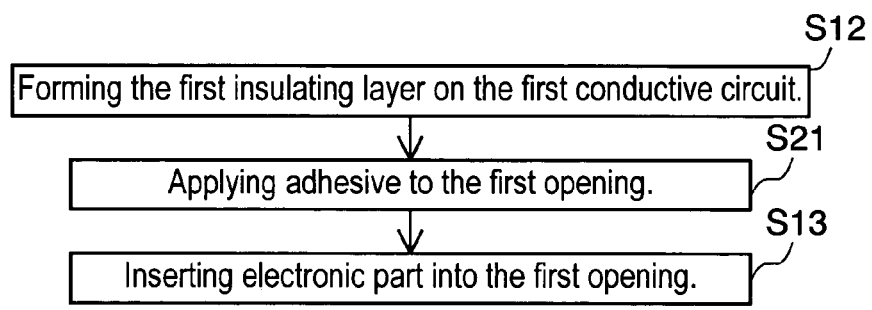
FIG. 14 is a part of a flow chart for describing the manufacturing process of the modification of the circuit board of the first exemplary embodiment.

FIG. 12 and FIG. 13 are diagrams for describing a modified method of manufacturing a circuit board. The modified method additionally includes a step of applying adhesive to a bottom of the first opening 320 between step S12 and step S13 described in the first exemplary embodiment, thereby bonding the electronic part 4 beforehand, and this point differs from the first exemplary embodiment. FIG. 14 is a part of a flow chart additionally including a step of "applying adhesive to the first opening" that is step 21 between step 12 and step 13.

In the circuit board of this modification, the first opening 320 is formed the same as in the first exemplary embodiment. This is identical with the shape shown in FIG. 3 (step 12). Subsequently, as shown in FIG. 12, adhesive 53 is applied to the first opening 320 (step 21). After that, as shown in FIG. 13, the electronic part 4 is inserted into the first opening 320 in such manner that a surface at an opposite side of the electrode terminals 41 are opposed to the base film 11, which is then secured with adhesive 53 (step S13). The steps thereafter are same as in the first exemplary embodiment, and their description is omitted.

Thus, even when a shape of first opening 320 is poor inaccuracy, electronic part 4 can be correctly secured in a predetermined position. In that case, even when the first opening 320 becomes larger than the electronic part 4, causing a gap to be created between the first opening 320 and the electronic part 4, the gap will be filled with the second insulating layer 17 to be formed later. Accordingly, even in case a plurality of electronic parts 4, including relatively many electrode terminals 41, are mounted, positional deflection of electronic parts 4 from each other can be lessened, and therefore, forming the second conductive circuit 19 by printing or the like will not cause shorting trouble or the like. This is effective especially in a case of using a bare chip IC as electronic part 4, and a large number of electrode terminals 41.

Second Exemplary Embodiment

Figure 22:
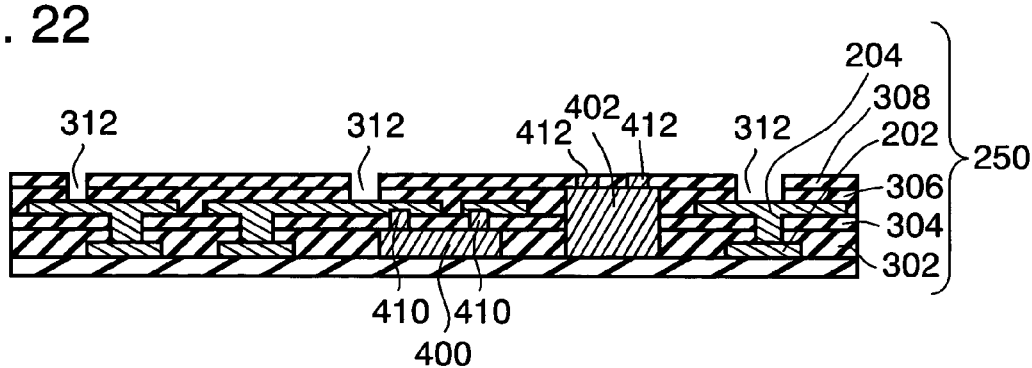
FIG. 22 is a sectional view of a fourth insulating layer, out of the sectional views showing the main manufacturing process of the circuit board of the second exemplary embodiment.
Figure 23:
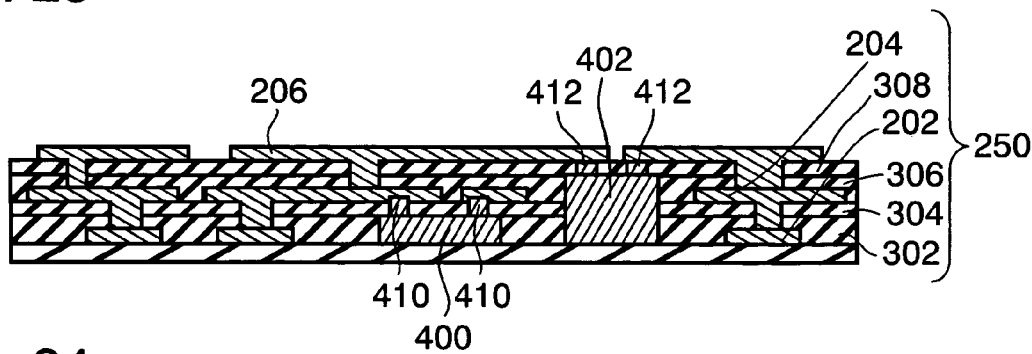
FIG. 23 is a sectional view of a third conductive circuit, out of the sectional views showing the main manufacturing process of the circuit board of the second exemplary embodiment.
Figure 24:
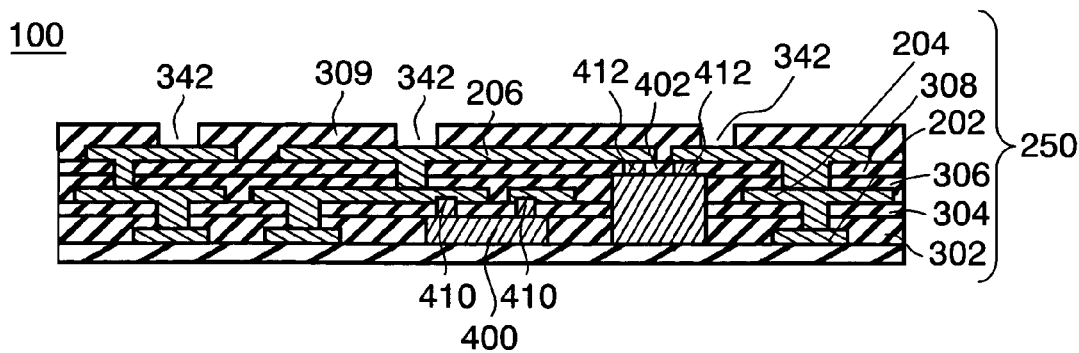
FIG. 24 is a diagram showing a sectional view of a completed circuit board of the second exemplary embodiment.
Figure 25:
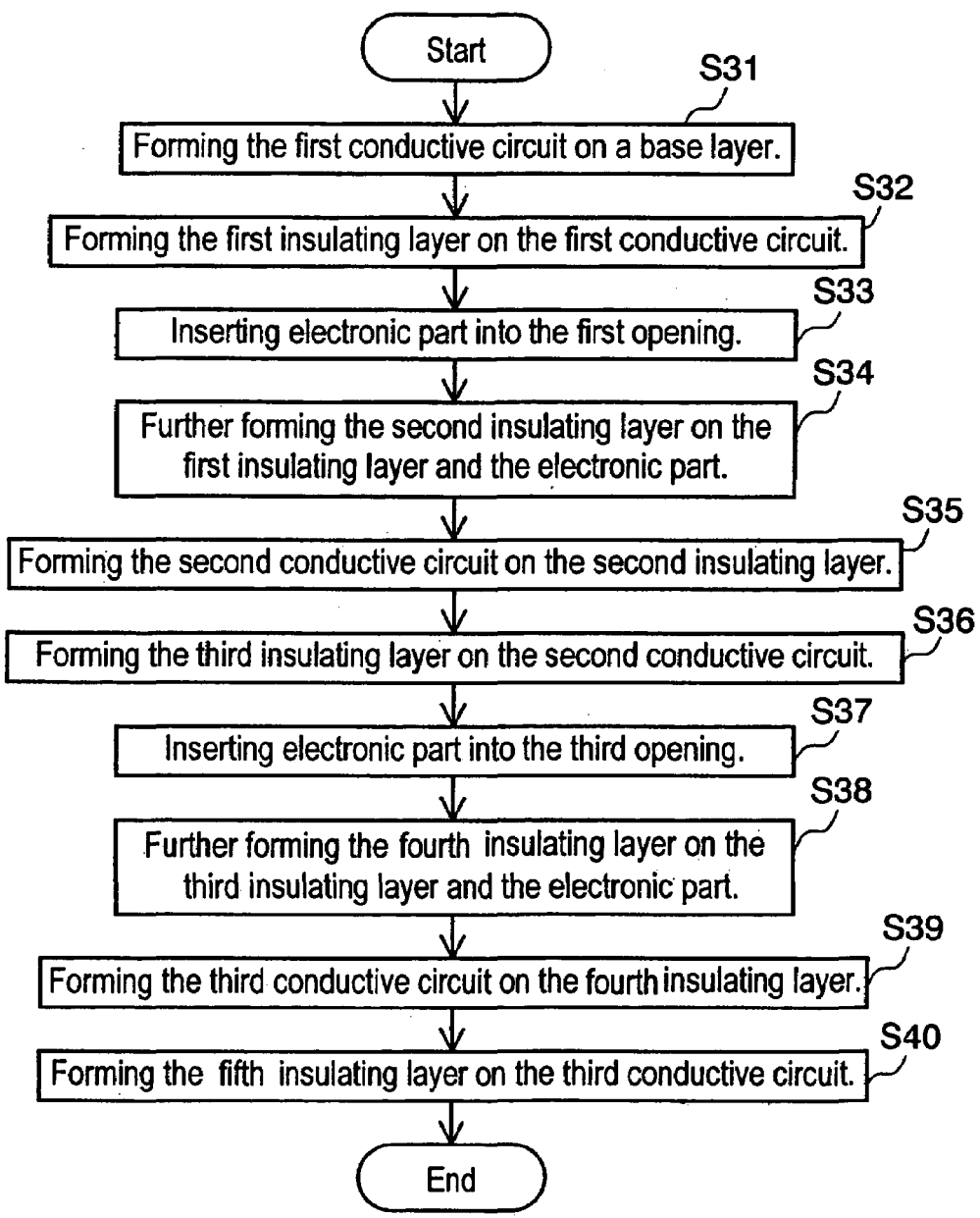
FIG. 25 is a flow chart for describing the main manufacturing process of the circuit board of the second exemplary embodiment.

FIG. 15 to FIG. 24 show sectional views of main manufacturing processes of circuit board 100 in a second exemplary embodiment of the present invention. FIG. 24 is a sectional shape of completed circuit board 100. Also, FIG. 25 is a flow chart of the main manufacturing processes of the present exemplary embodiment. The main manufacturing processes of the circuit board 100 of the present exemplary embodiment are same as in the first exemplary embodiment except that manufacture of resistors, capacitors and inductors is omitted in a first half of the processes, and like reference numerals refer to like component elements.

Figure 15:
FIG. 15 is a sectional view of a first conductive circuit, out of sectional views showing a main manufacturing process of a circuit board of a second exemplary embodiment of the present invention.

First, base film 11 as a base layer is prepared the same as in the first exemplary embodiment. As shown in FIG. 15, a predetermined wiring pattern is formed on the base film 11 by performing a screen printing process or the like with use of silver paste that is a conductive paste material, which is heated and hardened to form first conductive circuit 202 (step S31).

Figure 16:
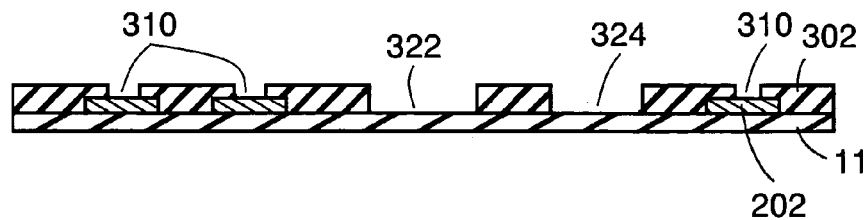
FIG. 16 is a sectional view of a first insulating layer, out of the sectional views showing the main manufacturing process of a circuit board of the second exemplary embodiment.

Next, as shown in FIG. 16, conductive paste material is printed onto the base film 11 and the first conductive circuit 202 by performing a screen printing process or the like, which material is heated and hardened to form first insulating layer 302 (step S32). In this case, via 310 is formed in the first insulating layer 302 so that a part of the first conductive circuit 202 is exposed. At the same time, the first opening 322 and third opening 324 for inserting electronic parts are formed in the first insulating layer 302 on the base film 11.

Figure 17:
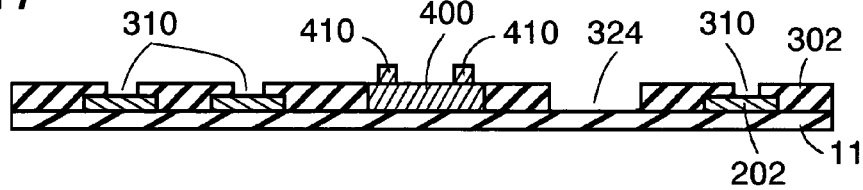
FIG. 17 is a sectional view of an electronic part inserted into a first opening, out of the sectional views showing the main manufacturing process of the circuit board of the second exemplary embodiment.

Subsequently, as shown in FIG. 17, electronic part 400 is inserted into the first opening 322 (step S33). In this case, the electronic part 400 is inserted in such a manner that a surface at an opposite side of electrode terminals 410 formed on one surface of the electronic part 400 comes into contact with the base film 11. Also in the present exemplary embodiment, a bare chip IC having electrode terminals 410 with bumps formed thereon is used as the electronic part 400.

Figure 18:
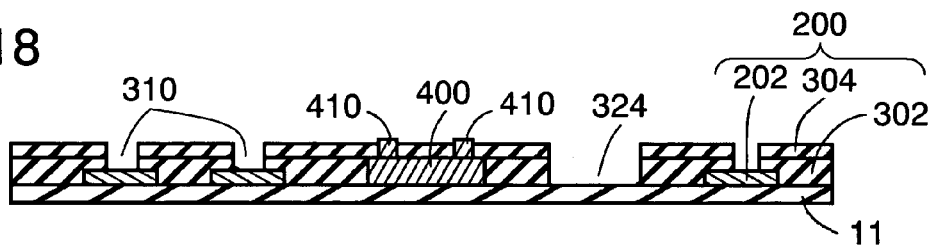
FIG. 18 is a sectional view of a second insulating layer, out of the sectional views showing the main manufacturing process of the circuit board of the second exemplary embodiment.

Next, as shown in FIG. 18, second insulating layer 304 is formed so as to cover a surface of electronic part 400, except the electrode terminals 410, and a surface of the first insulating layer 302. The second insulating layer 304 is formed by screen printing or the like of insulating paste material, followed by heating and hardening (step S34) of this material. In this case, the insulating paste material is not printed on the via 310 and the third opening 324 formed in the first insulating layer 302, thereby leaving surfaces intact. As a result, the via 310, the third opening 324, and the electrode terminals 410 of electronic part 400 are in a state of being exposed on the second insulating layer 304. In this condition, the first conductive circuit 202, the first insulating layer 302, and the second insulating layer 304 configure part arrangement layer 200 in relation to the electronic part 400.

Figure 19:
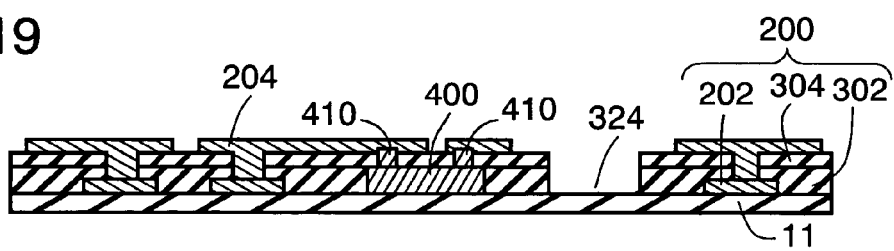
FIG. 19 is a sectional view of a second conductive circuit, out of the sectional views showing the main manufacturing process of the circuit board of the second exemplary embodiment.

After the second insulating layer 304 is formed on the electronic part 400, as shown in FIG. 19, a predetermined wiring pattern is printed on the second insulating layer 304, which is heated and hardened to form the second conductive circuit 204. The second conductive circuit 204 is formed by a screen printing process or the like with use of silver paste that is a conductive paste material (step S35). In this case, since the silver paste material is also applied to the via 310, the first conductive circuit 202 and the second conductive circuit 204 are electrically connected with each other. Further, the electrode terminals 410 of electronic part 400 are also electrically connected to each other by the second conductive circuit 204. The first insulating layer 302 and the second insulating layer 304 serve to electrically insulate the first conductive circuit 202 from the second conductive circuit 204 at portions except at the via 310.

Figure 20:
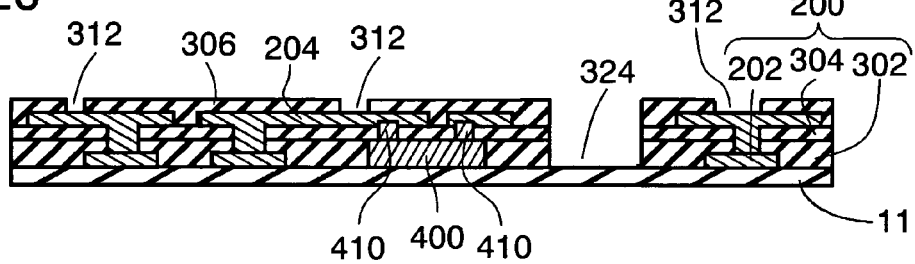
FIG. 20 is a sectional view of a third insulating layer, out of the sectional views showing the main manufacturing process of the circuit board of the second exemplary embodiment.

Next, as shown in FIG. 20, third insulating layer 306 is formed on the second conductive circuit 204 and the second insulating layer 304, which are upper layers. The third insulating layer 306 is also formed by screen printing or the like of insulating paste material, followed by heating and hardening this material (step S36). In this case, via 312 is properly formed in the third insulating layer 306 as needed to meet a circuit design requirement.

The above steps are nearly the same as those of the manufacturing method in the first exemplary embodiment. Through these steps, the electronic part 400 is connected to the second conductive circuit 204, and a circuit board of a multi-layer configuration including a plurality of insulating layers can be obtained. In the present exemplary embodiment, another electronic part 402 is further mounted in the third opening 324.

Figure 21:
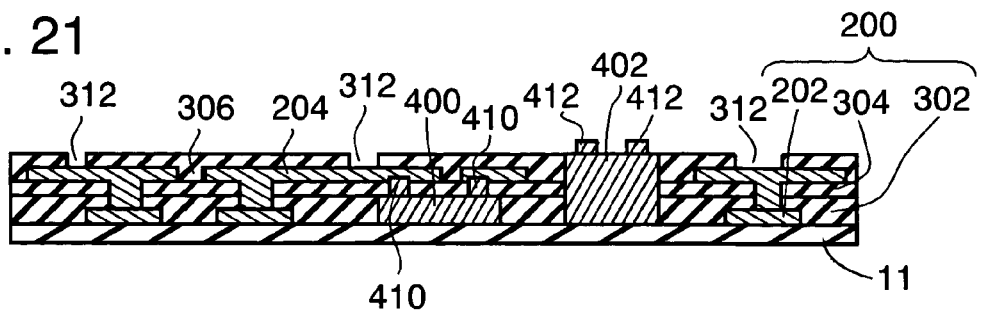
FIG. 21 is a sectional view of an electronic part inserted into the third opening, out of the sectional views showing the main manufacturing process of the circuit board of the second exemplary embodiment.

As shown in FIG. 21, another electronic part 402 is inserted into the third opening 324 (step S37). The electronic part 402, same as with the electronic part 400 initially mounted, is inserted in such manner that a surface at an opposite side of electrode terminals 412 formed on one surface thereof comes into contact with the base film 11. The another electronic part 402 is required to be larger in thickness than the electronic part 400. Therefore, when a bare chip IC is used, it should be thicker than the electronic part 400. Also, a package IC or the like is to be used.

After that, as shown in FIG. 22, fourth insulating layer 308 is formed on a surface of the electronic part 402, except for electrode terminals 412, and a surface of the third insulating layer 306. The fourth insulating layer 308 is also formed by screen printing or the like of an insulating paste material, followed by heating and hardening this material (step S38). In this case, the via 312 formed in the third insulating layer 306 is left intact, and the electrode terminals 412 of electronic part 402 are exposed on the fourth insulating layer 308. In this condition, layers including the second conductive circuit 204, the third insulating layer 306 and the fourth insulating layer 308, in addition to the first conductive circuit 202, the first insulating layer 302 and the second insulating layer 304 configuring the part arrangement layer 200 described above, configure part arrangement layer 250 in relation to the electronic part 402.

After the fourth insulating layer 308 is formed on the electronic part 402, third conductive circuit 206 is formed on the fourth insulating layer 308 as shown in FIG. 23. The third conductive circuit 206 is also formed by screen printing or the like of silver paste which is a conductive paste material, followed by heating and hardening this material (step S39). In this case, since the silver paste is applied to the via 312 as well, the second conductive circuit 204 and the third conductive circuit 206 are electrically connected with each other. Further, the electrode terminals 412 of electronic part 402 are electrically connected to each other by the third conductive circuit 206. The third insulating layer 306 and the fourth insulating layer 308 serve to electrically insulate the second conductive circuit 204 from the third conductive circuit 206 at portions except at the via 312.

Next, as shown in FIG. 24, fifth insulating layer 309 is formed on the third conductive circuit 206 and the fourth insulating layer 308. The fifth insulating layer 309 is also formed by screen printing or the like of insulating paste material, followed by heating and hardening this material (step S40). The fifth insulating layer 309 is provided with via 342 for making the third conductive circuit 206 exposed at predetermined portions according to a circuit design. The via 342 is also used as an electrode for connection when another electronic part such as chip type electronic part (not shown) is mounted, or circuit board 100 is built into electronic equipment (not shown). Incidentally, shown in FIG. 24 is circuit board 100 whose configuration includes no chip type electronic part or the like.

Also, in the present exemplary embodiment, manufacturing steps of resistors, capacitors and inductors are not illustrated, and this description is omitted, but it is possible to manufacture these parts according to the same steps as in the first exemplary embodiment.

As described above, in the circuit board of the present exemplary embodiment, electronic parts 400, 402, different in thickness, are disposed in respective part arrangement layers, and their electrode terminals are connected to respective conductive circuits. Accordingly, a multilayer circuit is formed of a prescribed thickness with the electronic part 402 being greater in thickness than electronic part 400, and the electronic parts 400, 402 are also mounted. Consequently, it is possible to make the circuit board 100 thinner and higher in density. Also, since flexibility is maintained due to such reduction in thickness of the circuit board, it becomes possible to bend and install the circuit board in electronic equipment as needed.

In the circuit board 1 of the first exemplary embodiment, a base layer is the base film 11, and conductive circuits are formed in multiple layers on the base film 11. On the other hand, in the circuit board 100 of the second exemplary embodiment, the base film 11 serves as a base layer foundation for the first conductive circuit 202 and the second conductive circuit 204, while the second insulating layer 304 serves as a base layer for the second conductive circuit 204 and the third conductive circuit 206. That is, supposing a relative base layer supporting a multi-layer conductive circuit, a complicated multi-layer structure can be formed by repeating formulation of a multi-layer conductive circuit on the basis of a base layer.

Also, as with the first exemplary embodiment, it is preferable to remove the base film 11 after forming all layers. Further, when the electronic parts are inserted into the first opening and the second opening, it is preferable to previously apply adhesive into these openings so that the electronic parts are secured to the base film 11 by the adhesive.

Third Exemplary Embodiment

Figure 26:
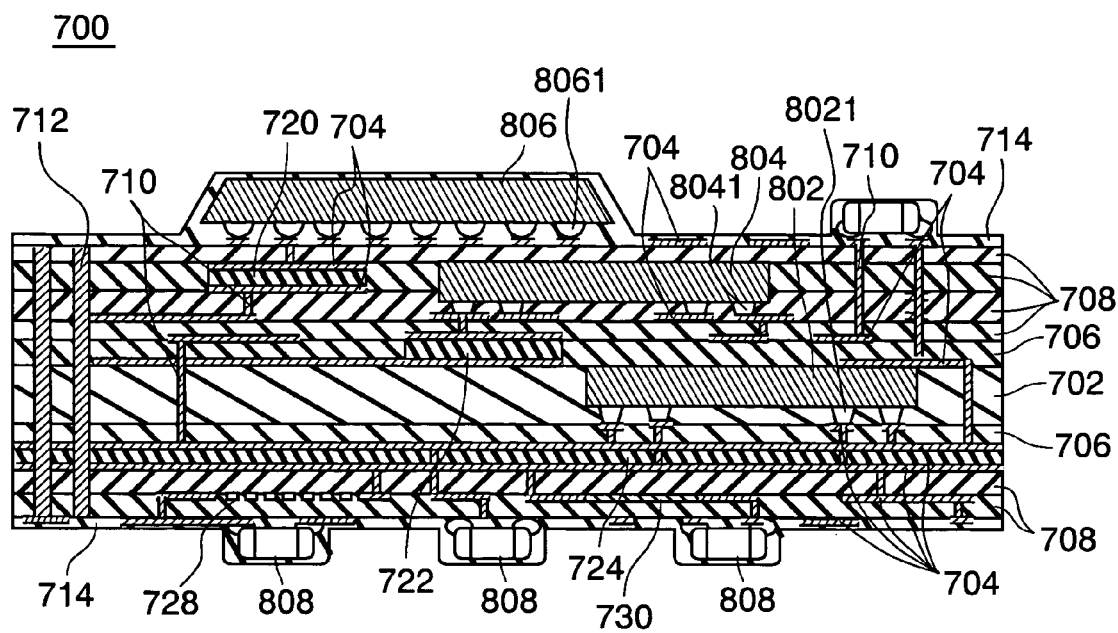
FIG. 26 is a sectional view of a circuit board of a third exemplary embodiment of the present invention.

FIG. 26 is a diagram showing a sectional shape of circuit board 700 in the third exemplary embodiment of the present invention. In forming the circuit board 700 of the present exemplary embodiment, base film 702 is used as a base layer, but it is required to be thicker than the base film of the first exemplary embodiment and the second exemplary embodiment, so as to be able to have electronic parts mounted therein. The circuit board 700 is configured such that a multi-layer circuit is formed on both sides of the base film 702 with use of conductive paste material and insulating paste material, and such that electronic part 802 is also built into the base film 700.

A manufacturing method for the circuit board 700 of the present exemplary embodiment will be described in the following.

First, the electronic part 802 is press-fitted into the base film 702. During the press-fitting step, the electronic part 802 is press-fitted into the base film 702 from an electrode terminals 8021 side, which electrode terminals are formed on one surface of the electronic part 802, and the electrode terminals 8021 are exposed at least from a surface of the base film 702. Accordingly, the base film 702 is required to be thick and plastic such that the electronic part 802 may be press-fitted thereinto. For example, when using PET resin film, the PET resin film is previously heated and then the electronic part 802 can be easily press-fitted thereinto. Also, as the electronic part 802, it is desirable to use a part that is relatively low in height, such as an IC or the like of a bare chip IC and chip size package (CSP) configuration.

Next, a conductive paste material is printed on both surfaces of base film 702 by performing a screen printing process or the like, followed by heating and hardening of this material to form conductive circuit 704. After that, further on these both surfaces, conductive circuit 704 and insulating layer 708 are laminated by same manufacturing method as in the first exemplary embodiment and the second exemplary embodiment, thereby forming a circuit structure of a multi-layer configuration.

In this case, same as with the first exemplary embodiment and the second exemplary embodiment, electronic part 804 is inserted and buried, and capacitors 720, 722, 724, resistor 730, and inductor 728 are formed on predetermined portions as needed. In the present exemplary embodiment, an example of using bare chip IC having electrode terminals 8041 with bumps formed thereon is shown as the electronic part 804. Also, the capacitors 720, 722, 724 are formed in layers different in thickness respectively, and the capacitor 724 is especially formed over a wide area and has a large capacity.

In the circuit board 700 of the present exemplary embodiment, there is provided a heat dissipating layer 706 for efficiently dissipating heat internally generated, which is, however, not needed when heat to be dissipated is low in quantity. The heat dissipating layer 706 can be formed, for example, by coating insulating paste mixed with alumina powder of high heat conductivity, and is also used as an insulating layer.

Further, in the circuit board 700 of the present exemplary embodiment, besides built-in via 710, through-electrode 712, which goes through each layer including the base film 702, is also formed.

On an outermost surface, chip type electronic part 808, being an electronic part, and electronic part 806 comprising a package IC such as chip size package (CSP) and ball grid array (BGA), are connected by conductive adhesive or anisotropic conductive resin or the like between respective connections and predetermined portions of a conductive circuit. Also, these electronic parts are secured by insulating adhesive as needed. In the present exemplary embodiment, the electronic part 806 is a package IC of BGA configuration, and balls that are electrode terminals 8061 are formed on one surface thereof.

Further, after mounting these parts, sealing film 714 is formed to complete the circuit board 700 of the present exemplary embodiment.

As described above, it is possible to easily obtain circuit boards having various structures by using conductive paste material and insulating paste material.

Figure 27:
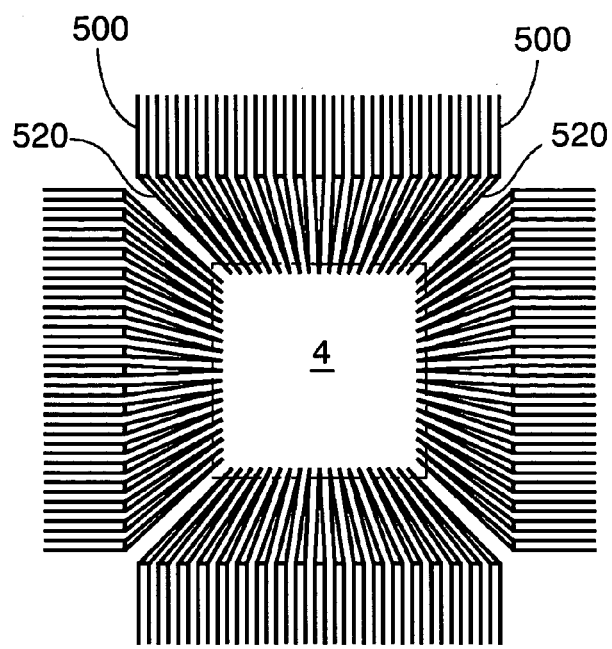
FIG. 27 is a plan view showing a connection between a part of a conductive circuit and metallic wiring, for describing a modification of a conductive circuit used in the present invention.

In the first exemplary embodiment through the third exemplary embodiment, a conductive circuit is formed by printing a conductive paste material, but it is preferable to employ another manufacturing method for a part of the conductive circuit. FIG. 27 is a plan view of a connection between partial pattern 500 of a conductive circuit and metallic wiring 520, illustrating a configuration of a connection of the conductive circuit to the metallic wiring formed by any one of depositing, plating and sputtering processes. The partial pattern 500 of the conductive circuit, formed by screen printing or the like of a conductive paste material, is connected to the metallic wiring 520 that is formed from metal material such as copper (Cu) and aluminum (Al). The configuration shown in FIG. 27 is formed in a region to which electronic part 4 is connected, for example, in the second conductive circuit 19 of the circuit board 1 shown in FIG. 10. Or, this configuration is formed as a part of the second conductive circuit 204 or the third conductive circuit 206 for connecting the electronic parts 400, 402 of the circuit board 100 shown in FIG. 24.

The metallic wiring 520 shown in FIG. 27 is mainly used for connecting electrode terminals, 41, 410, 412 of electronic parts 4, 400, 402, to second conductive circuits 19, 204 and third conductive circuit 206, respectively, when a pitch between electrodes of the electrode terminals 41, 410, 412 of electronic parts 4, 400, 402 is very fine, for example, when this pitch is at most 50 µm. That is, even when the pitch is very fine, a highly accurate pattern can be formed by forming metallic wiring 520 by performing a depositing, plating or sputtering process. Other portions can be formed by a printing process with use of a conductive paste material. In this way, even when a fine pitch, that is difficult to realize by using a conductive paste material, is required, it is possible to manufacture circuit boards 1, 100 without difficulty.

Modifications of circuit boards 1, 100 of the present invention will be further described in the following with reference to the drawings.

Figure 28:
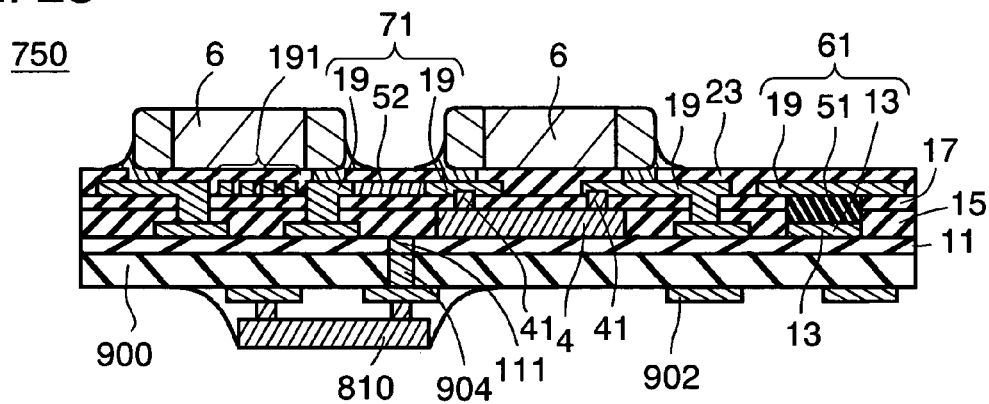
FIG. 28 is a sectional view of a circuit board having a laminated configuration of a circuit board and a plate member, for describing a modification of a conductive circuit of the present invention.

FIG. 28 is a sectional view of circuit board 750 of a laminated configuration, wherein resin plate member 900 is bonded to circuit board 1 of the first exemplary embodiment. The plate member 900 is formed with circuit 902, and is also provided with electronic part 810. That is, the plate member 900 itself forms a circuit board. Also, the plate member 900 is formed with through-electrode 904 that connects with the circuit 902. Additionally, base film 11 is also formed with through-electrode 111. The through-electrode 111 can be formed, for example, together with first conductive circuit 13. Because the through-electrode 111 of the base film 11 is opposed and bonded to the through-electrode 904 of the plate member 900, the conductive circuit 13 on the base film 11 is electrically connected to the circuit 902 on the plate member 900. Thus, it is possible to realize a large-scale circuit board 750, wherein the circuit 902 and electronic part 810 provided on the plate member 900 are integrated with the circuit 13 of the base film 11. As the electronic part 810, it is also preferable to use a chip type electronic part or the like, such as a resistor or capacitor, as well as a bare chip IC or package IC. Also, there are no particular limitations on a number of parts mounted.

It is also preferable to manufacture a multi-layer structure, by the manufacturing method described in the first exemplary embodiment or the second exemplary embodiment, on one surface, using the plate member 900 instead of using the base film 11. In this case, on the plate member 900 is formed a circuit, furnished with electronic parts, of a multi-layer configuration with use of conductive paste material and insulating paste material. A circuit board of such configuration is rather poor in flexibility, but it is possible to reduce thickness relatively easily, even in case of realizing a similar scale of circuits, as compared with a method of laminating a plurality of circuit boards as in prior art.

Figure 29:
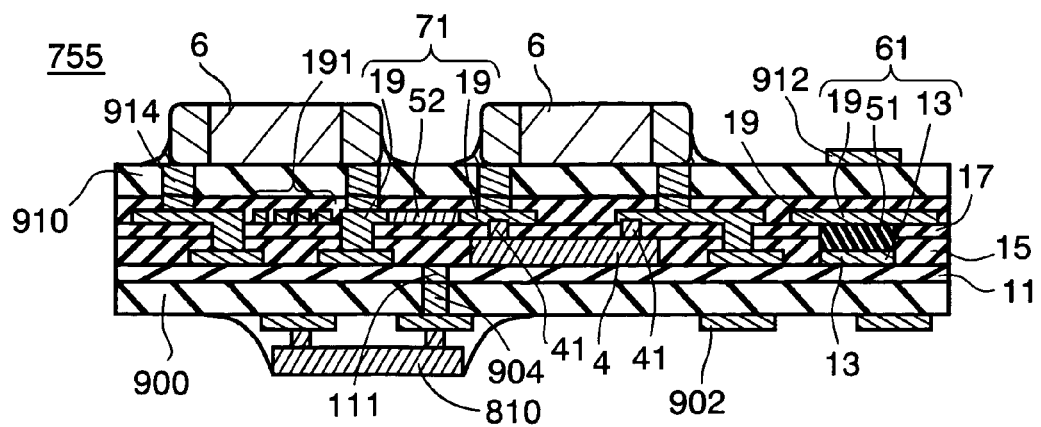
FIG. 29 is a sectional view of a circuit board having a laminated configuration of plate members with the circuit board of the first exemplary embodiment of the present invention bonded therebetween.

FIG. 29 is a sectional view of circuit board 755 of a dual side laminated configuration, wherein resin plate members 900, 910 are bonded to either side of the circuit board of the first exemplary embodiment. The plate members 900, 910 are formed with circuits 902, 912, respectively. Further, one plate member 900 is provided with the electronic part 810. Also, the other plate member 910 is provided with a chip type electronic part 6 that is an electronic part. In the present exemplary embodiment, the electronic part 810 is a bare chip IC or package IC, and the chip type electronic part 6 is a resistor or capacitor. The chip type electronic part 6 is also included in the electronic parts, but it is handled separately for convenience of description. Namely, in the circuit board 755 shown in FIG. 29, circuits formed by conductive paste material and insulating paste material, and electronic part 4 built into these circuits, are held between plate members 900, 910, thereby realizing a larger-scale circuit board 755.

Figure 30:
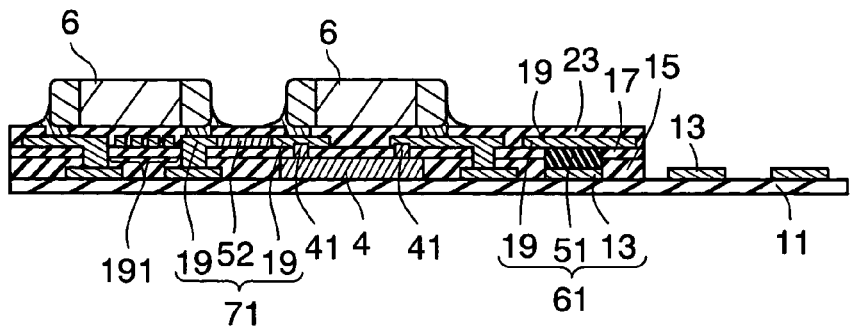
FIG. 30 is a sectional view showing another modification of the circuit board of the first exemplary embodiment of the present invention.

FIG. 30 is a sectional view showing a further modification of the circuit board 1 of the first exemplary embodiment. Circuit board 760 of this modification is characterized in that there is provided an insulated layer at a part of base film 11, or a region where a multi-layer circuit is not formed. That is, a part of the base film 11 is projected in a tongue-like shape, and first conductive circuit 13 is extended to the portion of this region. The first conductive circuit 13 of this projected region is used as connection terminals for connecting the circuit board 760 to external equipment (not shown). As a result, it becomes easier to bend, as needed, when mounting the circuit board 760 in electronic equipment.

Figure 31:
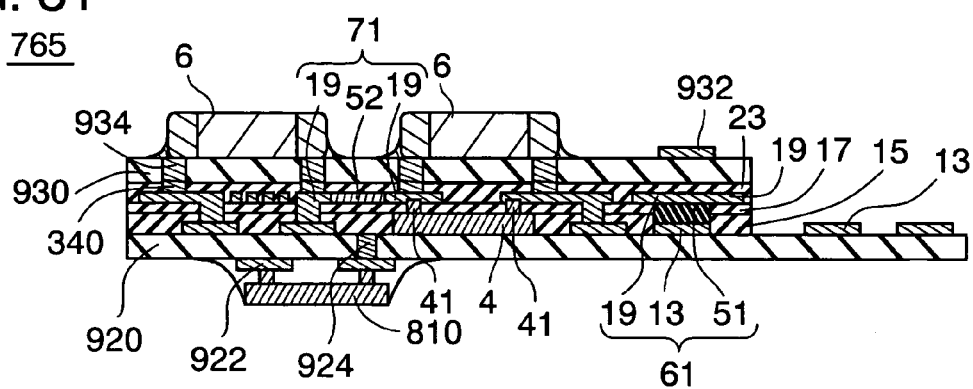
FIG. 31 is a sectional view showing a further modification of the circuit board of the first exemplary embodiment of the present invention.

FIG. 31 is a sectional view showing another modification of the circuit board 1 of the first exemplary embodiment. In circuit board 765 of this modification, plate member 920 is used instead of base film 11, and a multi-layer circuit is manufactured on the plate member 920, excluding a part of a projected region thereof. Further, another plate member 930 is laminated on a multi-layer circuit to manufacture the circuit board 765.

Circuit 922 and through-electrode 924 are formed on the plate member 920. On one surface of the plate member 920 is formed a multi-layer circuit by the same manufacturing method as that of the first exemplary embodiment. After forming up to third insulating layer 23, another plate member 930 is laminated in such a manner that the through-electrode 934 of another plate member 930 aligns with via 340. After that, chip type electronic parts 6, being electronic parts such as resistors and capacitors, are connected to the second conductive circuit 19 via the through-electrode 934 and the via 340. Also, electronic part 810 is mounted on the plate member 920 as well. The circuit board 765 thus manufactured is a large-scale circuit board realized by integrating a multi-layer circuit structure using conductive paste material and the plate members 920, 930. Further, first conductive circuit 13 in the projected region of the plate member 920 can be used as connection terminals for connecting the circuit board to external equipment.

The circuit board 765 shown in FIG. 31 is configured such that the plate member 920 provided with the electronic part 810 is projected, but it is also preferable to be configured such that another plate member 930 mounted with chip type electronic part 6 is projected. Further, for mounting the electronic part 810 and chip type electronic part 6, it is preferable to mount these parts before forming or bonding the multi-layer circuit.

Figure 32:
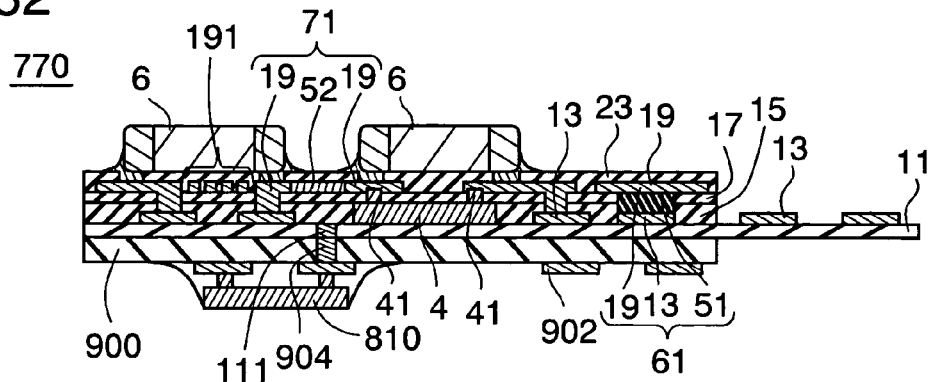
FIG. 32 is a sectional view of the circuit board as shown in FIG. 29 with a base film protruded therefrom.

FIG. 32 is a sectional view of circuit board 770, wherein base film 11 is projected as in the circuit board 755 shown in FIG. 29. That is, a multi-layer circuit is formed on the base film 11 except at a projected portion by using conductive paste material and insulating paste material. This structure is such that the plate member 900 is bonded to a region corresponding to the multi-layer circuit. In this way, in a projected region of the base film 11, sufficient flexibility can be maintained because only first conductive circuit 13 is formed on the base film 11. Accordingly, it is possible to bend the circuit board as needed when mounting it in electronic equipment. And, the circuit board can be connected to other parts in the electronic equipment, using the first conductive circuit 13 formed on the projected region as connection terminals.

Figure 33:
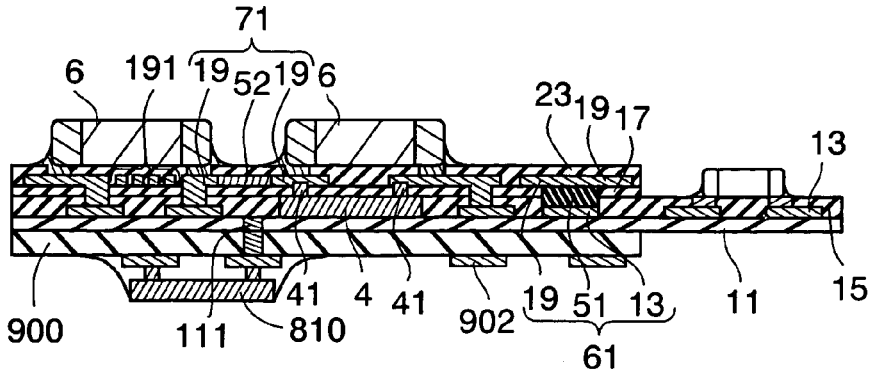
FIG. 33 is a sectional view of the circuit board as shown in FIG. 29 with a base film protruded therefrom, a circuit formed on a protruded region of the base film, and an electronic part mounted on the protruded region of the base film.

FIG. 33 is a sectional view showing another configuration provided with a chip type electronic part 6 as an electronic part, wherein base film 11 is projected and first conductive circuit 13 and first insulating layer 15 are formed on a projected region of the base film in the circuit board shown in FIG. 29. Thus, unlike a shape of plate member 900, it is preferable to make the base film 11 larger, with a multi-layer circuit formed on the base film 11 and an electronic part mounted portion, or to make the plate member 900 larger.

The exemplary embodiments of the present invention have been described above, but the present invention is not limited to the above exemplary embodiments, and it is possible to adopt various modifications.

For example, a circuit board with electronic parts built thereinto has been described in the present exemplary embodiments, but it is preferable to mount electronic parts on a surface of a circuit board instead of building them thereinto.

Also, in the above exemplary embodiments, examples of using conductive paste material including thermosetting resin, insulating paste material, resistant paste material, and dielectric paste material have been described, but the present invention is not limited to this. For example, it is preferable to use a paste material including resin having a UV-setting property. Also, it is possible to use a material that naturally hardens at room temperature provided that there arises no problem of hardening speeds.

Also, in the configuration shown in FIG. 27, it is described such that when metallic wiring is connected to a conductive circuit, the metallic wiring is formed by a depositing, plating or sputtering process. However, it is also preferable to form an entirety of any one layer of a plurality of conductive circuits by performing a depositing, plating or sputtering process.

As electronic parts built into a circuit board of the present invention, it is preferable to use chip type electronic parts such as resistors and capacitors, and multiple chip type electronic parts as well as a bare chip IC as described above. Also, these electronic parts are not required to be formed with bumps. When conductive paste material is used, it is preferable to make an opening in an insulating layer at a position corresponding to an electrode of an electronic part and apply conductive paste to the opening in order to connect the electrode terminals of the electronic part to a conductive circuit with the conductive paste material.

Also, the conductive circuit and the insulating layer are not limited to a fixed thickness, and are preferably partially different in thickness. When conductive circuits and insulating layers, which are not constant in thickness, are placed one upon another, the conductive circuits and insulating layers then formed are not parallel with a base film, but this does not cause any particular problems. It is possible to manufacture a complicated circuit board of a three-dimensional configuration by laminating layers which are not constant in thickness or not parallel with the base film. A circuit of a three-dimensional configuration can be easily manufactured by performing a coating method including printing of a conductive paste material and insulating paste material.

What is claimed is:

1. A circuit board, comprising:
   an electronic part having an electrode terminal on one surface thereof;
   a base layer;
   a first conductive circuit, manufactured by hardening a conductive paste material formed in a predetermined shape on said base layer;
   a first insulating layer, manufactured by hardening an insulating paste material formed on said base layer and said first conductive circuit, said first insulating layer having an opening therein;
   a second insulating layer on said first insulating layer; and
   a second conductive circuit, manufactured by hardening a conductive paste material formed in a predetermined shape on said second insulating layer;
   wherein said electronic part is within said opening such that said electronic part, but not said electrode terminal, is covered by said second insulating layer, and said electrode terminal is electrically connected to said second conductive circuit.

2. The circuit board according to claim 1, wherein said first insulating layer is only on a part of said base layer.

3. The circuit board according to claim 1, wherein said base layer comprises a film member.

4. The circuit board according to claim 3, further comprising:
   a plate member on a part of a surface of said base layer that is opposite to a surface of said base layer on which said first conductive circuit is formed.

5. The circuit board according to claim 1, wherein said base layer comprises a plate member.

6. The circuit board according to claim 5, further comprising:
   another plate member,
   wherein at least said first insulating layer is positioned between said base layer and said another plate member.

7. The circuit board according to claim 1, further comprising:
   a connection opening in said first insulating layer on said first conductive circuit,
   wherein said first conductive circuit and said second conductive circuit are electrically connected to each other via said connection opening.

8. The circuit board according to claim 1, further comprising:
   a resistance layer, formed by hardening a resistance paste material coated onto one of said base layer and said second insulating layer,
   wherein said resistance layer forms a resistor electrically connected to one of said first conductive circuit and said second conductive circuit.

9. The circuit board according to claim 1, further comprising:
   a resistance layer, formed by hardening a resistance paste material applied to a resistance opening in said first insulating layer,
   wherein said resistance layer forms a resistor electrically connected to said first conductive circuit and said second conductive circuit.

10. The circuit board according to claim 1, further comprising:
    a dielectric layer, formed by hardening a dielectric paste material coated onto one of said base layer and said first second insulating layer,
    wherein said dielectric layer forms a capacitor electrically connected to one of said first conductive circuit and said second conductive circuit.

11. The circuit board according to claim 1, further comprising:
    a dielectric layer, formed by hardening a dielectric paste material applied to a dielectric opening in said first insulating layer,
    wherein said dielectric layer forms a capacitor electrically connected to said first conductive circuit and said second conductive circuit.

12. The circuit board according to claim 1, wherein a part of one of said first conductive circuit and said second conductive circuit forms an inductor.

13. The circuit board according to claim 1, wherein one of said first conductive circuit and said second conductive circuit is connected to metallic wiring formed by any one of a depositing, plating and sputtering process.

14. The circuit board according to claim 13, wherein said electronic pad comprises a bare chip IC, and said metallic wiring is connected to an electrode terminal of a bare chip IC.

15. The circuit board according to claim 1, further comprising:
    electronic parts mounted on said second conductive circuit.

* * * * *

UNITED STATES PATENT AND TRADEMARK OFFICE
CERTIFICATE OF CORRECTION

| | | |
|---|---|---|
| PATENT NO. | : 7,180,749 B2 | Page 1 of 1 |
| APPLICATION NO. | : 10/727650 | |
| DATED | : February 20, 2007 | |
| INVENTOR(S) | : Norihito Tsukahara et al. | |

It is certified that error appears in the above-identified patent and that said Letters Patent is hereby corrected as shown below:

In column 15, line 21, please change "second insulating layer;" to --second insulating layer,--.

In column 16, lines 20-21, please change "and said first second insulating" to --and said second insulating--.

Signed and Sealed this

Sixth Day of November, 2007

JON W. DUDAS
*Director of the United States Patent and Trademark Office*